United States Patent
Wang et al.

(10) Patent No.: US 9,252,710 B2
(45) Date of Patent: Feb. 2, 2016

(54) FREE LAYER WITH OUT-OF-PLANE ANISOTROPY FOR MAGNETIC DEVICE APPLICATIONS

(71) Applicant: Headway Technologies, Inc., Milpitas, CA (US)

(72) Inventors: Yu-Jen Wang, San Jose, CA (US); Guenole Jan, San Jose, CA (US); Ru-Ying Tong, Los Gatos, CA (US)

(73) Assignee: Headway Technologies, Inc., Milpitas, CA (US)

( * ) Notice: Subject to any disclaimer, the term of this patent is extended or adjusted under 35 U.S.C. 154(b) by 380 days.

(21) Appl. No.: 13/686,169

(22) Filed: Nov. 27, 2012

(65) Prior Publication Data

US 2014/0145792 A1     May 29, 2014

(51) Int. Cl.
| | |
|---|---|
| H03B 15/00 | (2006.01) |
| G11B 5/66 | (2006.01) |
| H01F 10/32 | (2006.01) |
| H01F 41/30 | (2006.01) |
| H01L 43/08 | (2006.01) |
| H01L 43/10 | (2006.01) |
| B82Y 40/00 | (2011.01) |
| H01F 10/12 | (2006.01) |
| G01R 33/00 | (2006.01) |
| G11B 5/65 | (2006.01) |
| G11B 5/00 | (2006.01) |
| G11B 5/39 | (2006.01) |

(52) U.S. Cl.
CPC .............. *H03B 15/006* (2013.01); *B82Y 40/00* (2013.01); *G01R 33/00* (2013.01); *G11B 5/65* (2013.01); *G11B 5/66* (2013.01); *H01F 10/123* (2013.01); *H01F 10/3272* (2013.01); *H01F 10/3286* (2013.01); *H01F 10/3295* (2013.01); *H01F 41/303* (2013.01); *H01L 43/08* (2013.01); *H01L 43/10* (2013.01); *G11B 2005/0024* (2013.01); *G11B 2005/3996* (2013.01)

(58) Field of Classification Search
CPC .............................. H03B 15/00; H03B 15/006
USPC ........... 331/94.1; 365/158, 171; 257/295, 421
See application file for complete search history.

(56) References Cited

U.S. PATENT DOCUMENTS

| | | | |
|---|---|---|---|
| 7,558,103 | B2 | 7/2009 | Nakamura et al. |
| 2007/0159734 | A1* | 7/2007 | Nguyen et al. ............. 360/324.1 |

(Continued)

FOREIGN PATENT DOCUMENTS

GB         2 422 735        8/2006

OTHER PUBLICATIONS

PCT Search Report PCT/US2013/071227 Mailed: Mar. 19, 2014, Headway Technologies, Inc.

(Continued)

*Primary Examiner* — Jeffrey Shin
(74) *Attorney, Agent, or Firm* — Saile Ackerman LLC; Stephen B. Ackerman

(57) ABSTRACT

Synthetic antiferromagnetic (SAF) and synthetic ferrimagnetic (SyF) free layer structures are disclosed that reduce Ho (for a SAF free layer), increase perpendicular magnetic anisotropy (PMA), and provide higher thermal stability up to at least 400° C. The SAF and SyF structures have a FL1/DL1/spacer/DL2/FL2 configuration wherein FL1 and FL2 are free layers with PMA, the coupling layer induces antiferromagnetic or ferrimagnetic coupling between FL1 and FL2 depending on thickness, and DL1 and DL2 are dusting layers that enhance the coupling between FL1 and FL2. The SAF free layer may be used with a SAF reference layer in STT-MRAM memory elements or in spintronic devices including a spin transfer oscillator. Furthermore, a dual SAF structure is described that may provide further advantages in terms of Ho, PMA, and thermal stability.

42 Claims, 5 Drawing Sheets

(56) References Cited

U.S. PATENT DOCUMENTS

| | | | |
|---|---|---|---|
| 2008/0094886 A1* | 4/2008 | Ranjan et al. | 365/171 |
| 2011/0032644 A1 | 2/2011 | Watts et al. | |
| 2011/0096443 A1 | 4/2011 | Zhang et al. | |
| 2011/0121418 A1* | 5/2011 | Xi et al. | 257/421 |
| 2012/0087185 A1 | 4/2012 | Zhou et al. | |
| 2012/0155164 A1* | 6/2012 | Shukh | 365/171 |
| 2012/0241878 A1 | 9/2012 | Hu et al. | |
| 2012/0267733 A1 | 10/2012 | Hu et al. | |

OTHER PUBLICATIONS

"Novel Stack Structure of Magnetic Tunnel Junction with MgO Tunnel Barrier Prepared by Oxidation Methods: Preferred Grain Growth Promotion Seed Layers and Bi-layered Pinned Layer," by Young Suk Choi, et al., Japanese Journal of Applied Pysics 48 (2009) 120214, XP-001551670, Published Dec. 7, 2009, pp. 1-3.

"Current-driven excitation of magnetic multilayers," by J.C. Slonczewski, Journal of Magnetism and Magnetic Materials 159 (1996) L1-L7, Elsevier, Jun. 1996.

"Microwave Assisted Magnetic Recording," by Jian-Gang Zhu et al., IEEE Transactions on Magnetics, vol. 44, No. 1, Jan. 2008, pp. 125-131.

Co-pending U.S. Appl. No. 13/406,972, filed Feb. 28, 2012, "High Thermal Stability Reference Structure with Out-of-Plane Anisotropy for Magnetic Device Applications," by Yu-Jen Wang, et al., 36 pgs.

Co-pending U.S. Appl. No. 13/609,780, filed Sep. 11, 2012, "Minimal Thickness Synthetic Antiferromagnetic (SAF) Structure with Perpendicular Magnetic Anisotropy for STT-MRAM," by Robert Beach, et al., 38 pgs.

* cited by examiner

FREE LAYER WITH OUT-OF-PLANE ANISOTROPY FOR MAGNETIC DEVICE APPLICATIONS

RELATED PATENT APPLICATIONS

This application is related to the following: Ser. No. 13/406,972, filing date Feb. 28, 2012; and Ser. No. 13/609,780, filing date Sep. 11, 2012; both assigned to a common assignee and herein incorporated by reference in their entirety.

TECHNICAL FIELD

The present disclosure relates to a magnetic device that utilizes thin films with perpendicular magnetic anisotropy (PMA) and a method for making the same, and in particular, to decreasing the Ho field from a reference layer on a free layer while increasing Hc and thermal stability in the resulting multilayer magnetic stack with a synthetic antiferromagnetic (SAF) free layer having enhanced RKKY coupling.

BACKGROUND

Magnetoresistive Random Access Memory (MRAM), based on the integration of silicon CMOS with MTJ technology, is a major emerging technology that is highly competitive with existing semiconductor memories such as SRAM, DRAM, and Flash. Similarly, spin-transfer (spin torque or STT) magnetization switching described by C. Slonczewski in "Current driven excitation of magnetic multilayers", J. Magn. Magn. Mater. V 159, L1-L7 (1996), has recently stimulated considerable interest due to its potential application for spintronic devices such as STT-MRAM on a gigabit scale. J-G. Zhu et al. has described another spintronic device called a spin transfer oscillator (STO) in "Microwave Assisted Magnetic Recording", IEEE Trans. on Magnetics, Vol. 44, No. 1, pp. 125-131 (2008) where a spin transfer momentum effect is relied upon to enable recording at a head field significantly below the medium coercivity in a perpendicular recording geometry. The STO comprises a stack including a spin injection layer (SIL) with PMA character, an oscillating field generation layer (FGL) with in-plane anisotropy, and a spacer between the SIL and FGL.

Both MRAM and STT-MRAM may have a MTJ element, based on a tunneling magneto-resistance (TMR) effect wherein a stack of layers has a configuration in which two ferromagnetic layers typically referred to as a reference layer and free layer are separated by a thin non-magnetic dielectric layer. The MTJ element is typically formed between a bottom electrode such as a first conductive line and a top electrode which is a second conductive line at locations where the top electrode crosses over the bottom electrode in a MRAM device. In another aspect, a MTJ element in a read head sensor may be based on a giant magnetoresistance (GMR) effect that relates to a spin valve structure where a reference layer and free layer are separated by a metal spacer. In sensor structures, the MTJ is, formed between two shields and there is a hard bias layer adjacent to the MTJ element to provide longitudinal biasing for stabilizing the free layer magnetization.

In a MTJ within a MRAM or STT-MRAM, a reference layer will usually exert a stray magnetic field upon the free layer that tends to favor either the P or AP state. The stray "offset" field (Ho) has a form similar to a non-uniform electric "fringing" field at the edges of a parallel plate capacitor. As depicted in FIG. 1, the stray field (Ho) 4 from reference layer 1 impinges on the free layer 3. Note that a dielectric spacer 2 such as a tunnel barrier layer separates the free layer and reference layer. When reference layer 1 is a composite, the net stray field 4 will be the sum of fringing fields from several similar layers in the reference layer stack with the possible addition of a uniform effective "interlayer" coupling field. The free layer is subject to random thermal agitation and the stray field will create a disparity in the thermal stability of the two states, with either the P or AP state rendered more thermally stable. This asymmetry is undesirable since for a given free layer coercivity (Hc), Ho should be zero for optimum stability. Generally, Ho=0 is difficult to achieve in practice, and as a rule, Ho<15% of Hc is a reasonable target in actual devices.

Materials with PMA are of particular importance for magnetic and magnetic-optic recording applications. Spintronic devices with perpendicular magnetic anisotropy have an advantage over MRAM devices based on in-plane anisotropy in that they can satisfy the thermal stability requirement and have a low switching current density but also have no limit of cell aspect ratio. As a result, spin valve structures based on PMA are capable of scaling for higher packing density which is one of the key challenges for future MRAM applications and spintronic devices.

When the size of a memory cell is reduced, much larger magnetic anisotropy is required because the thermal stability factor is proportional to the volume of the memory cell. Generally, PMA materials have magnetic anisotropy larger than that of conventional in-plane soft magnetic materials which utilize shape anisotropy. Thus, magnetic devices with PMA are advantageous for achieving low switching current and high thermal stability. For spin torque applications, a free layer with high Hc and low offset field (Ho) is required. In addition, the free layer preferably has a high energy barrier $Eb=KuV/K_BT$ where Ku is the magnetic anisotropy, V is the switching magnetic volume, $K_B$ is the Boltzmann constant, and T is the measurement temperature. A SAF free layer has been employed with a coupling layer (spacer) formed between two ferromagnetic layers (FL1 and FL2) having PMA in opposite directions in order to reduce coupling between a free layer and reference layer in a MTJ stack. Several PMA material systems for FL1 and FL2 include various ordered (i.e. $L1_0$) alloys, unordered alloys, and laminates represented by (Pt/Fe)n, (Pd/Co)n, (Ni/Co)n, and the like, where n is the lamination number. Magnetization direction for FL1 and FL2 is anti-parallel due to the RKKY coupling through a metal spacer. There is a big challenge to increase the RKKY (anti-ferromagnetic) coupling strength to enhance magnetic stability and thermal stability of the free layer to be compatible with semiconductor processes that reach as high as 400° C. or higher. A higher annealing temperature of >350° C. is also useful in achieving an enhanced TMR ratio.

None of existing technology is known to provide low Ho with high Hc and a Kb value approaching 70 for thermal stability in a PMA layer that will withstand high temperature processing up to 400° C. or greater which is required in fabrication methods. Therefore, a low cost multilayer stack with high PMA, high Hc, low Ho, and improved thermal stability is needed to enable PMA materials to be more widely accepted in a variety of magnetic device applications.

SUMMARY

One objective of the present disclosure is to provide a SAF free layer with PMA in MTJ stack in a magnetic device that has an Eb value greater than at least 70 and a low offset field (Ho) less than 100 Oe that is suitable for spintronic applications such as spin-torque MRAM (STT-MRAM), and microwave assisted magnetic recording (MAMR).

A second objective of the present disclosure is to provide a MTJ element with a SAF free layer having a magnetic coercivity (Hc) substantially greater than the Ho field to enable improved stability of the P or AP magnetic state in the free layer.

According to one embodiment of the present disclosure, these objectives are achieved by sequentially forming a reference layer, tunnel barrier layer, SAF free layer, and capping layer on a substrate wherein the SAF free layer has a FL1/dusting layer 1/coupling layer/dusting layer 2/FL2 configuration in which the FL1 and FL2 ferromagnetic layers have PMA character, the coupling layer is Ru, Cu, Cr, Rh, Mo, or other metals that induce RKKY or antiferromagnetic (AFM) coupling between FL1 and FL2 layers, and the DL1, DL2 dusting layers enhance the RKKY coupling. The substrate may be a seed layer that is one or more of NiCr, NiFeCr, Mg, Ta, TaN, Ti, Ru, or other materials that maintain or enhance PMA in an overlying reference layer. In one aspect, FL1 and FL2 are laminates such as $(Ni/Co)_n$, $(Pt/Co)_n$, $(Pd/Co)_n$, $(Co/Ru)_n$, and the like where n is the lamination number which is from 1 to 10, and preferably 1 to 4. However, Co may be replaced by a Co-rich alloy such as CoFe or CoFeB wherein Co content is greater than that of Fe or B, and Ni may be replaced by a Ni rich alloy such as NiFe or NiFeB. In an alternative embodiment, FL1 and FL2 are $L1_0$ ordered alloys including FePt, CoPt, and FePd. In yet another embodiment, FL1 and FL2 may be rare earth-transition metal (RE-TM) films such as TbFeCo, GdFeCo, and the like. When a high MR ratio is preferred, one or both of the FL1 and FL2 layers may be comprised of CoFeB or CoNiFeB.

A key feature is the dusting layer formed on top and bottom surfaces of the middle spacer that enhances antiferromagnetic coupling between the FL1 and FL2 layers. The dusting layer has a thickness between 1 and 50 Angstroms, and preferably from 1 to 10 Angstroms, and is made of Co, Fe, Ni, NiFe, or a $Co_xFe_yNi_z$ alloy wherein x, y, and z are the atomic % of Co, Fe, and Ni, respectively. The dusting layers may be deposited at room temperature or at an elevated temperature up to 400° C. Subsequently, annealing up to 400° C. or higher, and preferably 350° C., may be employed to further improve PMA properties and thereby increase Hc and Hk in the free layer.

In a first embodiment that represents a bottom spin valve configuration, a seed layer, reference layer, tunnel barrier layer, SAF free layer, and capping layer are sequentially formed on a substrate. The reference layer may be a composite with a SAF configuration represented by AP2/coupling layer/AP1 where AP1 and AP2 are antiparallel coupled ferromagnetic layers, or by RL1/DL5/coupling layer/DL6/RL2 configuration wherein RL1 and RL2 are first and second reference layers with PMA that have a laminated structure, an $L1_0$ ordered composition, or are made of a RE-TM film as described previously, and DL5 and DL6 are dusting layers formed on top and bottom surfaces of a coupling layer. The SAF free layer preferably has the FL1/DL1/coupling layer/DL2/FL2 structure described previously. In a STO embodiment, the SAF reference layer serves as the field generation layer (FGL) in a MAMR structure while the SAF free layer functions as a spin injection layer (SIL).

The present disclosure also encompasses an embodiment where the MTJ element has a top spin valve configuration in a STT-MRAM scheme represented by seed layer/SAF free layer/tunnel barrier/reference layer/capping layer wherein the SAF free layer has a FL1/DL2/coupling layer/DL1/FL2 design with the FL1 layer contacting the seed layer. The reference layer may have a SAF configuration that is represented by RL1/DL5/coupling layer/DL6/RL2 where RL1 and RL2 are selected from the same PMA materials as FL1 and FL2, and DL5 and DL6 are selected from the same dusting layer materials as DL1 and DL2. The coupling layer is a non-magnetic material such as Ru or Mo, for example.

According to a third embodiment, there may be a transitional layer made of CoFeB/Co or the like inserted between the SAF FL2 layer and tunnel barrier layer in a top spin valve configuration. In a bottom spin valve configuration with a SAF reference layer having PMA, the transitional layer may be inserted between the RL2 layer and the tunnel barrier layer.

In all embodiments, we observe that a substantial coercivity (Hc) and RKKY exchange coupling strength is maintained even after annealing at 400° C. for one hour. A dual SAF free layer structure may be used to further improve Hc and thermal stability and has a FL1/DL1/coupling layer 1/DL2/FL2/DL3/coupling layer 2/DL4/FL3 configuration where the FL1 layer contacts a tunnel barrier layer and the FL3 layer interfaces with a capping layer in a bottom spin valve MTJ stack.

In yet another embodiment, the coupling layer thickness in a FL1/DL1/coupling layer/DL2/FL2 scheme may be modified to yield a synthetic ferrimagnetic (SyF) free layer that is an alternative to a single free layer because of higher magnetic volume in the SyF structure.

DETAILED DESCRIPTION

The present disclosure is a multilayer stack with perpendicular magnetic anisotropy and enhanced RKKY coupling that may be employed as a reference layer, free layer, or dipole layer in magnetic devices such as MRAM and STT-MRAM, in spintronic devices such as MAMR, in various designs of PMA spin valves including MTJ elements, and in PMA magnetic media used in magnetic sensors and data storage. Although the exemplary embodiments depict a bottom spin valve or a top spin valve structure, the present disclosure also applies to dual spin valve designs as appreciated by those skilled in the art. A non-magnetic spacer that serves as an antiferromagnetic coupling layer in SAF structures described herein is hereafter mentioned simply as "coupling layer" to avoid confusion with the non-magnetic spacer formed between the free layer and reference layer in the MTJ stacks of the present disclosure.

Figure 1:
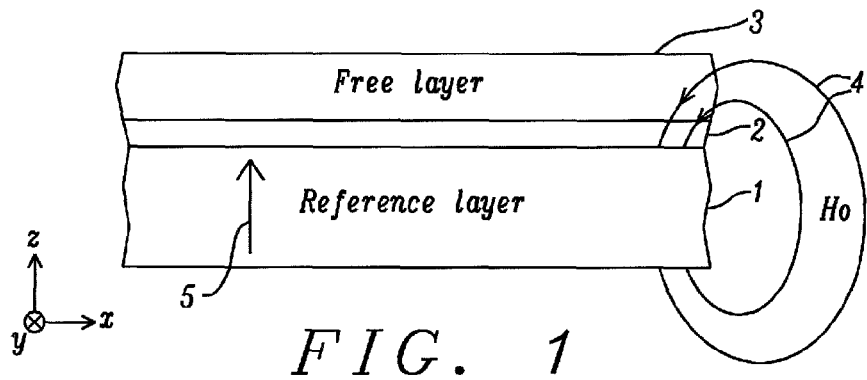
FIG. 1 is a cross-sectional view of a MTJ stack wherein a stray offset field (Ho) from a reference layer is exerted on a free layer.
Figure 2:
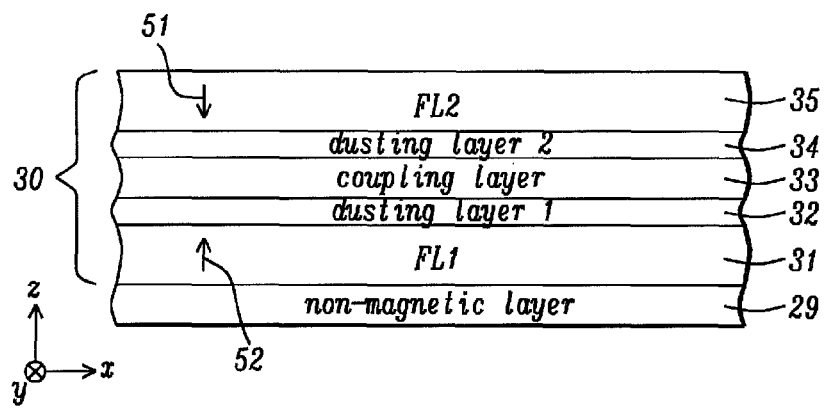
FIG. 2 is a cross-sectional view of a synthetic antiferromagnetic (SAF) free layer formed on a non-magnetic layer according to an embodiment of the present disclosure.

Referring to FIG. 2, the most basic representation of a synthetic anti-ferromagnetic (SAF) layer of the present disclosure is depicted as a SAF free layer 30 with a FL1/DL1/coupling layer/DL2/FL2 configuration that is formed on a substrate such as a non-magnetic layer (spacer) 29 which may be a tunnel barrier layer that is comprised of a dielectric material including one or more of MgO, AlOx, TiOx, ZnO, or other metal oxides or metal nitrides in a tunneling magnetoresistive (TMR) scheme, for example. Alternatively, the non-magnetic spacer may be comprised of Cu or another high conductivity metal or metal alloy in a giant magnetoresistance (GMR) embodiment. The present disclosure also anticipates a GMR embodiment wherein spacer 29 has a current confining path (CCP) structure in which a dielectric layer with metal paths therein is sandwiched between two metal layers (i.e. Cu) as appreciated by those skilled in the art.

The planes of the layers illustrated in all embodiments are in a (x, y) plane and each layer has a thickness in the z-axis direction. SAF free layer 30 is a composite with a lower ferromagnetic layer (FL1) 31 and an uppermost ferromagnetic layer (FL2) 35, and each of FL1 and FL2 has perpendicular magnetic anisotropy (PMA) that may be intrinsic or induced through an interface with an oxide layer, for example. In a preferred embodiment, there is a coupling layer 33 that induces RKKY coupling between the FL1 and FL2 layers, and there are first and second dusting layers DL1 32, DL2 34, respectively, that enhance the aforementioned RKKY coupling. Thus, FL1 layer 31 has a magnetization 52 aligned in a (+) z-axis direction and FL2 layer 35 has a magnetization 51 aligned in an opposite direction to that of FL1. In an alternative magnetic state, the directions of magnetizations 51, 52 are reversed with respect to the arrows shown in FIG. 2. Layers 31-35 may be sequentially sputter deposited on the non-magnetic layer 29. Thus, DL1 adjoins a top surface of FL1 31 and interfaces with a bottom surface of coupling layer 33 while DL2 interfaces with a top surface of the coupling layer and adjoins a bottom surface of FL2 35.

FL1 and FL2 layers 31, 35 may be a laminated structure such as $(Co/Ni)_n$, $(Co/Pd)_n$, $(Co/Pt)_n$, $(Co/Ru)_n$, or other laminated stacks exhibiting intrinsic PMA where n is between 1 and 10, and preferably from 1 to 4. It should be understood that the aforementioned laminated stacks may also be represented by $(Ni/Co)_n$, $(Pd/Co)_n$, $(Pt/Co)_n$, and $(Ru/Co)_n$, respectively, depending on which of the metal layers is deposited first. The present disclosure also anticipates that one or more of the laminated layers may be a Co-based alloy such as CoFe or CoFeB as a replacement for Co, and a Ni-based alloy such as NiCo, NiFe, or NiFeB may be a replacement for Ni. Preferably, the Co-based alloy is Co rich wherein the Co content is >50 atomic %, and the Ni-based alloy is Ni rich wherein the Ni content is >50 atomic %. Thus, $(CoFe/Ni)_n$, $(CoFeB/Ni)_n$, $(Co/NiFe)_n$, $(Co/NiFeB)_n$, and $(NiCo/Co)_n$ are alternatives for FL1 and FL2 layers. Typically, the Co or Co alloy layer in the laminates has a thickness between 0.5 and 5 Angstroms while the Pd, Pt, Ni, or Ni alloy layer has a thickness from 2 to 10 Angstroms. Note that FL1 and FL2 layers may have the same composition or may be made of different laminated stacks. Furthermore, the number of laminations in the FL1 layer 31 may differ from the number of laminations in the FL2 layer 35. Typically, as the number "n" of laminations increases, PMA within the laminated layer increases. However, the magnetoresistive (MR) ratio for a laminated layer such as $(Co/Ni)_n$ is generally less than observed for a CoFe or CoFeB layer.

In another embodiment, one or both of FL1 layer 31 and FL2 layer 35 are comprised of $L1_0$ ordered alloys such as FePt, CoPt, FePd, NiPt, FeNi, FeCu, MnAl, MnPt, MnPd, CuAu, and the like that have PMA character. In this case, FL1 and FL2 layers each have a thickness from 15 to 150 Angstroms. In yet another embodiment, FL1 and FL2 layers may be made of rare earth-transition metal (RE-TM) films including TbFeCo, GdFeCo, and the like that exhibit PMA. The present disclosure also anticipates that one of the FL1 and FL2 layers may be one of the aforementioned laminates, $L1_0$ alloy, or a RE-TM alloy while the other of the FL1 or FL2 layers is another of the laminates, $L1_0$ alloy, or a RE-TM alloy.

In yet another embodiment, one or both of the FL1 and FL2 layers is made of an alloy such as CoFeB or CoNiFeB that has PMA because interfacial perpendicular anisotropy is established as a result of an interface with an oxide, nitride, or oxynitride layer. For instance, when FL1 31 is CoFeB or CoNiFeB and interfaces with a non-magnetic spacer 29 that is a tunnel barrier comprised of MgO or the like, then PMA is generated in a FL1 layer having a thickness from 5 to 20 Angstroms. Likewise, when FL2 35 is CoFeB or CoNiFeB and interfaces with a capping layer (FIG. 3) made of an oxide, nitride, or oxynitride, then PMA is generated in a FL2 layer with a thickness from 5 to 20 Angstroms.

The coupling layer 33 is one of Ru, Cu, Cr, Rh, Ir, Mo, or other metals capable of inducing RKKY coupling between FL1 and FL2 layers 21, 25. Ru is often selected as the coupling layer because a higher coupling strength is achieved with a FL1/DL1/Ru/DL2/FL2 configuration when DL1 and DL2 are Co dusting layers. However, we have found that other coupling layers such as Mo when used with a Fe dusting layer will generate a RKKY coupling strength equal to greater than that provided by a Ru coupling layer and Co dusting layers. According to the present disclosure, the thickness of the metal coupling layer is between 2 and 20 Angstroms with 4 or 9 Angstroms being preferred since either of these thicknesses will lead to the largest RKKY anti-parallel coupling strength in a FL1/DL1/coupling layer/DL2/FL2 configuration. Note that 13 Angstroms is another coupling layer thickness that produces significant anti-parallel coupling strength. As explained later, an intermediate coupling layer thickness of 6 Angstroms or a coupling layer thickness less than 3 Angstroms may be selected to establish a synthetic ferrimagnetic (SyF) structure using the same stack of layers 31-35.

D1 layer 32 and D2 layer 34 are referred to as dusting layers and have a thickness between 1 and 50 Angstroms, and preferably from 1 to 10 Angstroms. The dusting layers are made of Co, Fe, Ni, or an alloy thereof such as CoFeNi or NiFe. We have found that inserting a first dusting layer between coupling layer 33 and FL1 layer 31, and a second dusting layer between the coupling layer and FL2 layer 35 provides an advantage in substantially enhancing the RKKY coupling strength thereby improving thermal stability of SAF free layer 30. Furthermore, a subsequent anneal up to 400° C., and preferably at about 350° C., after all layers in the SAF free layer stack are deposited, may be employed to further improve PMA properties by increasing Hc and Hk. DL1 layer 32 and DL2 layer 34 may be sputter deposited at room temperature (RT) or at elevated temperatures up to 400° C. or even higher. With dusting layer thicknesses greater than about 15 Angstroms, layers 31, 35 may have a canted magnetization angle where the magnetic moments 51, 52 are between 0 and 90 degrees with respect to the planes of the layers in the SAF free layer stack. In this case, a smaller PMA is achieved in the SAF free layer stack than with thinner DL1 and DL2 layers.

The present disclosure also encompasses an embodiment wherein only one dusting layer 32 or 34 is employed in a SAF structure. However, those skilled in the art will appreciate there is a substantial benefit in terms of higher RKKY coupling and greater thermal stability when using both dusting layers rather than only one.

Figure 3:
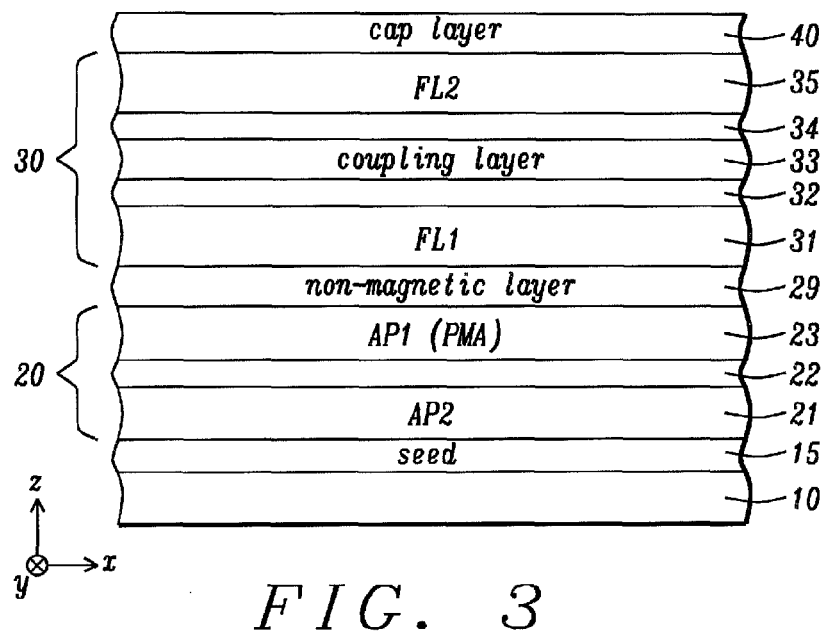
FIG. 3 is a cross-sectional view of a MTJ stack with a SAF free layer and a SAF reference layer in a bottom spin valve configuration according to an embodiment of the present disclosure.

Referring to FIG. 3, a second embodiment of the present disclosure is depicted and shows a magnetic tunnel junction (MTJ) stack wherein a seed layer 15, SAF reference layer 20, non-magnetic spacer 29, SAF free layer 30, and a capping layer 40 are sequentially formed on a substrate 10. The present disclosure also anticipates that an antiferromagnetic (AFM) layer (not shown) may be inserted between the seed layer and SAF reference layer to pin the magnetization direction of an adjoining AP2 layer in a SAF reference layer that has an AP2/coupling/AP1 configuration. The substrate may be a bottom electrode in a STT-MRAM, a main pole in a STO, or a bottom shield in a TMR sensor, for example. A seed layer 15 is selected that is comprised of one or more of NiCr, NiFeCr, Ta, TaN, Mg, Ru or other metals or alloys to maintain or enhance PMA, Hc, and Hk in overlying magnetic layers. In one aspect, the reference layer has a SAF structure with an antiferromagnetic coupling layer 22 made of Ru, Cu, Cr, Rh, Ir, or Mo sandwiched between AP2 and AP1 ferromagnetic layers. Preferably, AP1 layer 23 that adjoins a bottom surface of the non-magnetic spacer (tunnel barrier) 29 has PMA that is aligned in a direction parallel or anti-parallel to magnetization 52 in FL1 layer 31. PMA in AP1 layer 23 may be induced through an interface with the tunnel barrier. In one aspect, the AP1 layer may be comprised of CoFeB or CoFeB/Co. The AP2 layer 21 may be comprised of CoFe or the like with an in-plane magnetization.

The capping layer 40 formed on the SAF free layer 30 may be comprised of one or more non-magnetic metals including Ta, Ti, V, Mo, Zr, Hf, Pt, Pd, W, Nb, Rh, Ru, Cu, Cr, Os, and Ir. Optionally, the capping layer is comprised of a dielectric material that is a metal oxide or an oxide of a metal alloy including MgTaOx, MgO, MgZrOx, SiOx, SrTiOx, BaTiOx, CaTiOx, LaAlOx, MnOx, VOx, $Al_2O_3$, TiOx, BOx, ZrOx, and HfOx. Preferably, capping layer 40 is made of MgTaOx wherein the Mg:Ta ratio is from about 2:1 to 1:1. Moreover, the capping layer may be comprised of a lamination of one or more of the aforementioned oxides.

Figure 4:
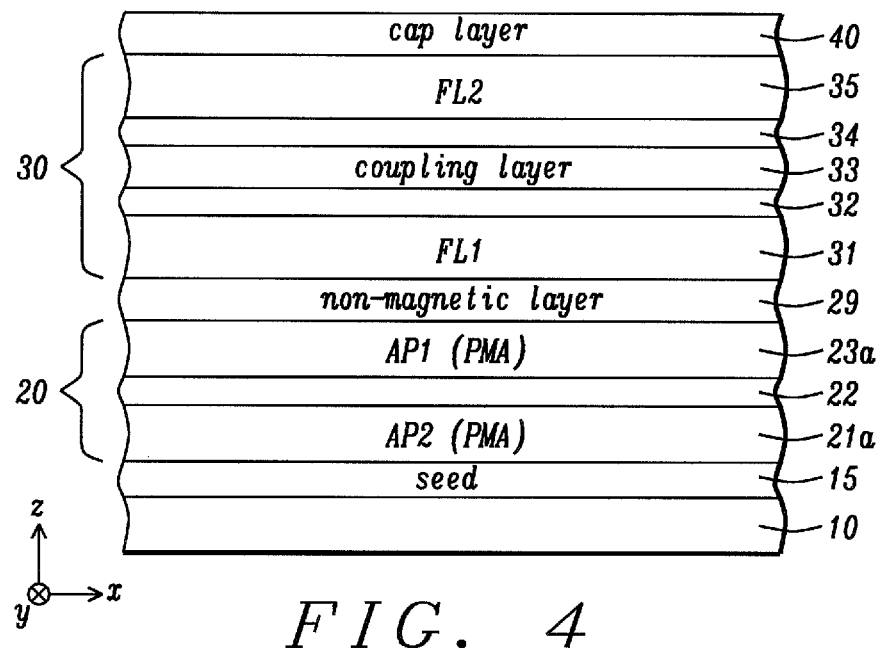
FIG. 4 is a cross-sectional view of the MTJ stack in FIG. 3 wherein both of the AP1 and AP2 layers in the SAF reference layer have perpendicular magnetic anisotropy.

Referring to FIG. 4, a third embodiment of the present disclosure is illustrated and retains the same features as the second embodiment except the AP2 layer 21a and AP1 layer 23a in the SAF reference layer 20 exhibit intrinsic PMA and may be comprised of the same laminated stack, $L1_0$ ordered alloy, or RE-TM film as previously described with respect to FL1 and FL2 layers 31, 35. Thus, the third embodiment has a bottom spin valve configuration wherein a seed layer, AP2 layer with PMA, coupling layer, AP1 layer with PMA, non-magnetic spacer, SAF free layer, and capping layer are consecutively formed on a substrate.

Figure 5:
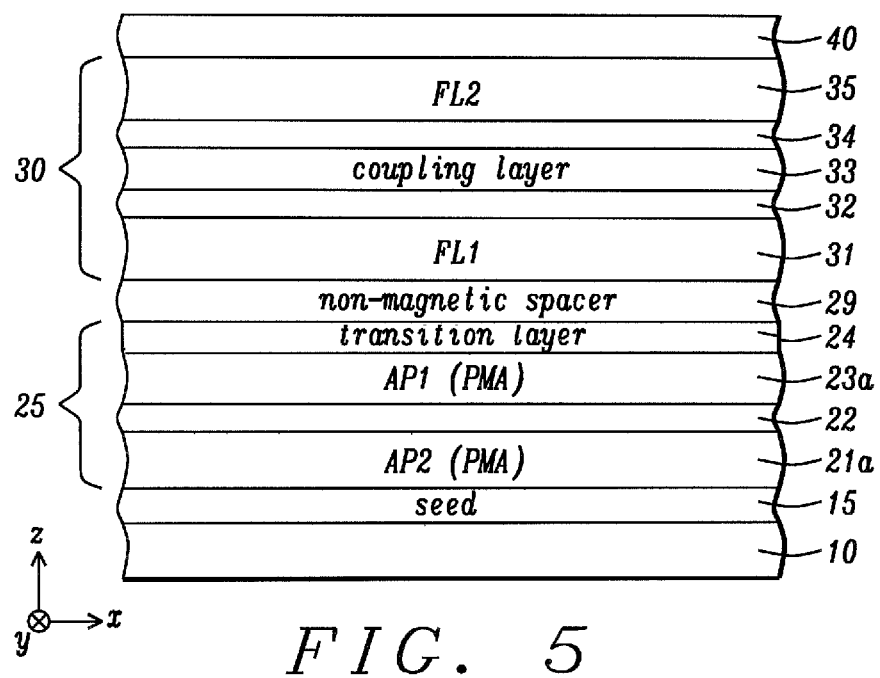
FIG. 5 is a cross-sectional view of the MTJ stack in FIG. 4 wherein the reference layer is further comprised of a transition layer between the AP1 layer and the non-magnetic spacer.

According to a fourth embodiment in FIG. 5, the MTJ stack of layers retains the same layers as in FIG. 4 except the reference layer, now designated as SAF reference layer 25, further includes an uppermost transition layer 24 between the AP1 layer 23a and non-magnetic spacer 29. The transition layer may be comprised of CoNiFeB, CoFeB, CoFe, Co, or composites thereof such as CoFeB/Co. In a preferred embodiment, the transition layer is formed between a (111) AP1 layer with PMA and a (100) MgO tunnel barrier, and is sufficiently thin to preserve the PMA property of layer 23a and yet thick enough to provide a high magnetoresistance (MR ratio). Thus, in a CoFeB/Co transitional layer 24, the CoFeB portion may be from 4 to 15 Angstroms thick, and preferably 6 Angstroms, while the Co layer portion is from 3 to 8 Angstroms, and preferably 4 Angstroms thick. Co may be used as the uppermost layer in the reference layer stack and the interface with the tunnel barrier layer since it is more resistant to oxidation than a CoFeB (or CoFe) layer. In other words, in a conventional MTJ, oxygen can migrate out of a MgO tunnel barrier layer into a reference layer thereby causing partial oxidation of CoFeB or the like, which leads to a degradation in the MR ratio.

Figure 6:
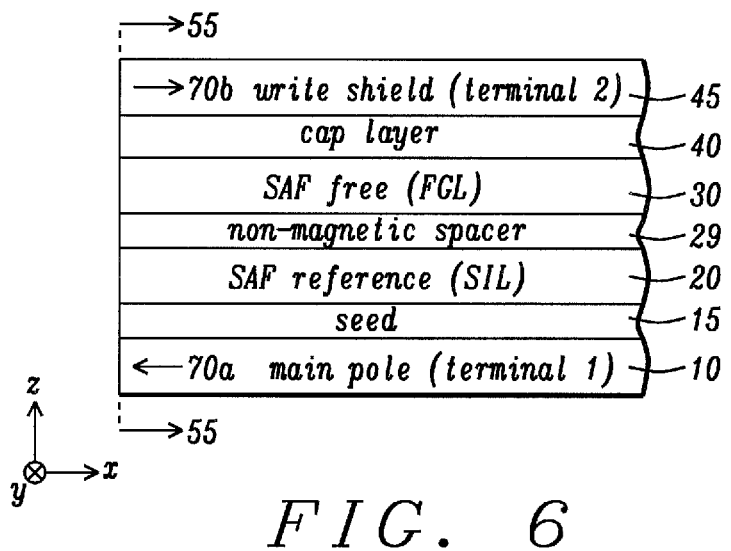
FIG. 6 depicts a cross-sectional view of a STO embodiment of the present disclosure wherein the SAF reference layer serves as a spin injection layer, and the SAF free layer is a field generation layer.

Referring to FIG. 6, a SAF free layer structure of the present disclosure may be incorporated in a MAMR embodiment wherein a spin torque oscillator (STO) structure is formed between two terminals. In the exemplary embodiment that depicts a portion of a perpendicular magnetic writer, the substrate 10 is a main pole layer and serves as a first terminal wherein magnetic flux 70a is directed through an air bearing surface (ABS) 55-55 and into a magnetic medium (not shown). After writing one or more magnetic bits, flux 70b returns to the write shield that is a second terminal 45. The STO structure has a first non-magnetic layer (NM1) such as seed layer 15 adjoining the first terminal 10, a second non-magnetic layer (NM2) that may be capping layer 40 adjoining the second terminal 45, and a third non-magnetic layer (NM3) such as spacer 29 formed between a spin injection layer (SIL) 20 and a field generation layer (FGL) 30 to give a NM1/SIL/NM3/FGL/NM2 configuration. The STO has a side 54 formed along the ABS, and the write head comprised of main pole 10, STO, and write shield 45 moves in a z-axis direction over a magnetic medium during a write process.

The SAF reference layer 20 functions as a SIL also known in the art as a spin polarization (SP) layer that spin polarizes current passing through the STO stack in a current perpendicular to plane (CPP) direction and thereby applies a spin torque on the SAF free layer 30 which serves as the FGL and is also referred to as an oscillation layer. As a result, when a dc bias is applied across the STO stack by injecting direct current with a critical current density into the first terminal 10 or into the second terminal 45, then spin torque on the FGL induces magnetization in layers 31, 35 in SAF structure 30 to oscillate with a large angle oscillation thereby generating a rf field that assists the writing process to a magnetic bit in the magnetic medium. In an alternative embodiment, the roles of the SAF free layer and SAF reference, layer may be reversed with SAF layer 30 serving as a SIL and SAF layer 20 functioning as the FGL. It should be understood that SAF reference layer 20 may be substituted with another SAF reference layer described in alternative embodiments or by any reference layer with PMA.

Figure 7:
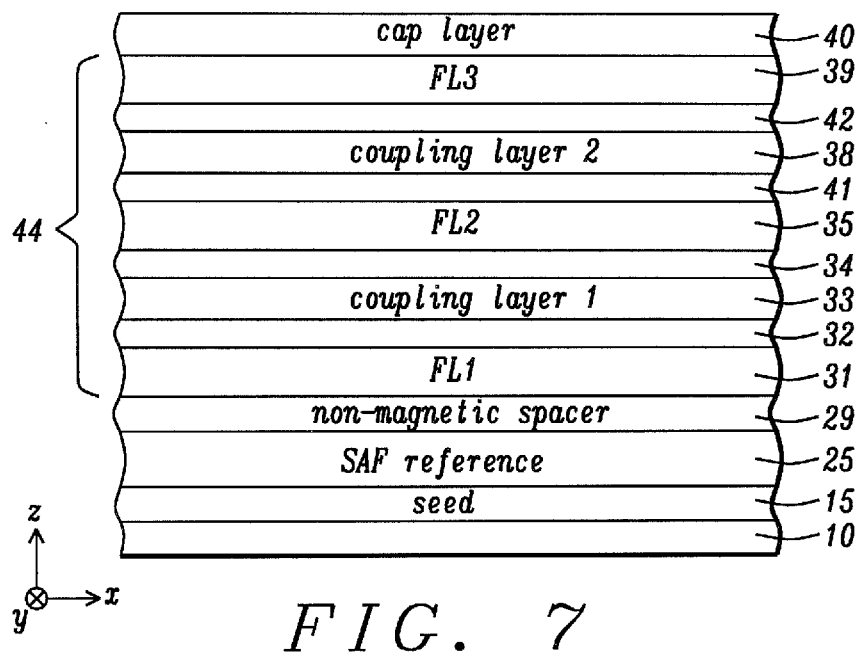
FIG. 7 is a cross-sectional view of a MTJ stack having a dual SAF free layer structure according to another embodiment of the present disclosure.

Referring to FIG. 7, a fifth embodiment of the present disclosure is depicted wherein the free layer has a dual SAF configuration. In this scheme, all the features of the fourth embodiment are retained. In addition, a third dusting layer DL3 41, second coupling layer 38, fourth dusting layer DL4 42, and third ferromagnetic layer FL3 39 are sequentially formed on a top surface of FL2 layer 35. The resulting dual SAF free layer structure 44 has a FL1/DL1/coupling layer 1/DL2/FL2/DL3/coupling layer 2/DL4/FL3 configuration. Note that FL3 layer 39 interfaces with a bottom surface of capping layer 40. The second coupling layer 38 induces RKKY coupling between the FL2 and FL3 layers and may be made of the same material as in the first coupling layer 33. DL3 and DL4 layers are selected from the same materials previously described with respect to the DL1 and DL2 layers and enhance RKKY coupling between the FL2 and FL3 layers. Furthermore, FL3 layer 39 has PMA and is preferably one of a laminated stack, $L1_0$ ordered alloy, or RE-TM film previously mentioned with regard to FL1 and FL2 layers 31, 35. Alternatively, the FL3 layer may be made of CoFeB or CoNiFeB. Moreover, one or both of the FL1 and FL2 layers may be CoFeB or CoNiFeB. It is believed that a dual SAF free layer design will further improve thermal stability and Hc for a SAF structure compared with the advantages achieved in previous embodiments for a single SAF free layer scheme.

When a SAF free layer structure is employed as described in the embodiments of the present disclosure, the magnetic interaction between the SAF free layer and SAF reference layer is reduced and thereby minimizes the offset field (Ho) on the free layer after patterning the MTJ stack of layers. The Ku (anisotropy constant) for the free layer will impact the Eb (energy barrier) of the memory cell and it is believed that the insertion of two or more dusting layers will also increase the PMA Ku of the free layer thereby increasing Eb and enhancing the retention time of STT-MRAM designs. The lamination number "n" in a SAF free layer 30 (or 37 or 44) is preferably minimized to between 1 and 4 in order to prevent Ku from becoming too high and requiring a substantially higher write current when switching the free layer.

Figure 8:
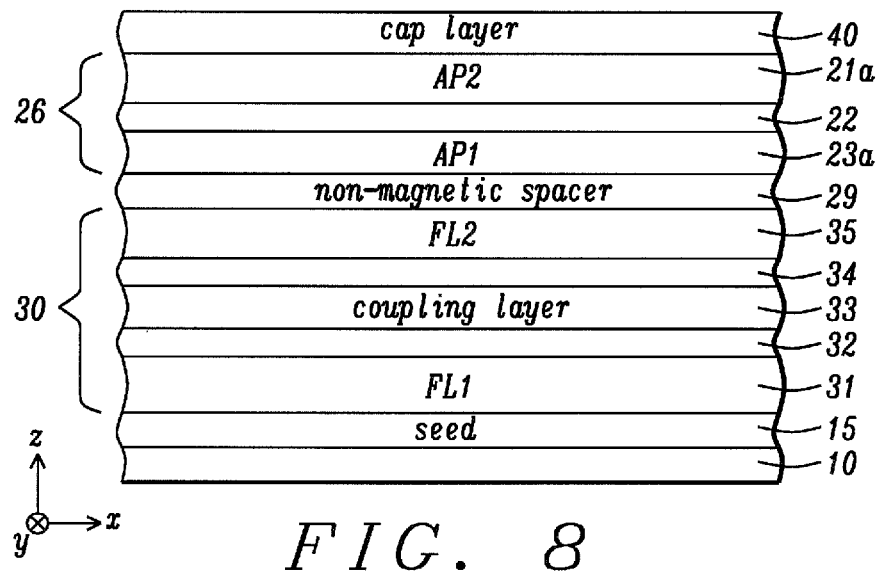
FIG. 8 is a cross-sectional view of a MTJ stack with a SAF free layer and a SAF reference layer in a top spin valve configuration according to an embodiment of the present disclosure.

The present disclosure also anticipates a top spin valve design as depicted in FIG. 8 wherein SAF free layer 30, non-magnetic spacer 29, reference layer 26, and capping layer 40 are consecutively formed on seed layer 15. The resulting MTJ configuration with a single SAF free layer scheme is represented as seed layer/FL1/DL1/coupling layer/DL2/FL2/non-magnetic spacer/AP1/coupling layer/AP2/cap layer. Therefore, the same layers are employed as in the bottom spin valve embodiment shown in FIG. 4 except the order of deposition on substrate 10 is modified. In particular, the order of AP1 and AP2 layer deposition is changed such that the AP1 layer 23a (or 23) contacts a top surface of the non-magnetic spacer and is deposited before the AP2 layer 21a (or 21) in reference layer 26.

Figure 9:
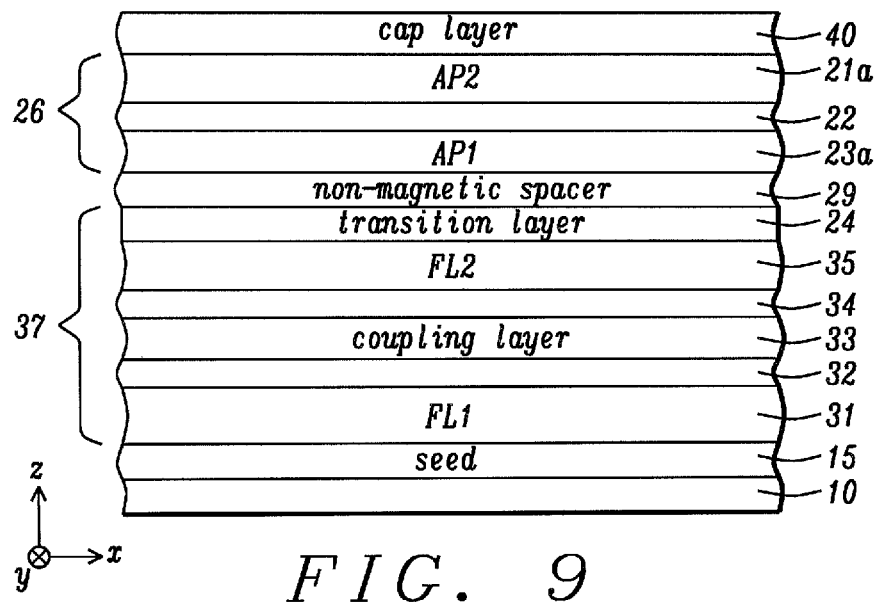
FIG. 9 is a cross-sectional view of the MTJ stack in FIG. 8 further comprised of a transition layer between the FL2 layer and the non-magnetic spacer according to an embodiment of the present disclosure.

Referring to FIG. 9, another top spin valve embodiment is illustrated and retains all of the features of the previous embodiment shown in FIG. 8 except where the SAF free layer structure is further comprised of an uppermost transition layer 24 such as CoFeB/Co as described in an earlier embodiment. As a result, SAF free layer 37 has a FL1/DL1/coupling layer/DL2/FL2/transition layer configuration wherein the transition layer forms an interface with the non-magnetic spacer 29.

The present disclosure also encompasses a synthetic ferrimagnetic (SyF) free layer structure. In particular, the SAF free layer in each of the embodiments depicted in FIGS. 2-9 may be modified to a SyF configuration by adjusting the thickness of the coupling layer 33 between FL1 layer 31 and FL2 layer 35. Moreover, in a dual SyF free layer embodiment, the thickness of both coupling layers 33, 38 is changed. Note that antiferromagnetic coupling is realized when the thickness of coupling layer 33 (and 38) is preferably 4, 9, or 13 Angstroms. However, when the coupling layer thickness is changed to 6 Angstroms or less than 3 Angstroms, then a SyF free layer structure is established wherein the magnetization of FL1 and FL2 layers are aligned in the same perpendicular to plane direction rather than in opposite directions for FL1 and FL2 in SAF embodiments. Thus, a SyF free layer according to one embodiment of the present disclosure has a FL1/DL1/coupling layer/DL2/FL2 configuration where all the layers have a composition as described in previous embodiments and wherein the coupling layer thickness is limited to 6 Angstroms or less than 3 Angstroms. In a dual SyF free layer configuration, FL1, FL2, and FL3 have magnetic moments in the same perpendicular to plane direction in contrast to a dual SAF free layer structure where the FL1 and FL3 magnetization direction is opposite to that of the FL2 magnetic moment. Moreover, the dusting layers enhance the ferrimagnetic coupling between the FL1 and FL2 layers. Although there is no beneficial reduction of Ho when a SyF free layer is employed, the SyF structure is believed to provide an advantage over a single free layer because of a higher magnetic volume and higher thermal stability. Once all of the layers in the MTJ stack are formed in the aforementioned embodiments, an annealing process may be performed that is comprised of a temperature between 200° C. and 500° C., and preferably between 300° C. and 400° C., for a period of 1 minute to 10 hours. Thereafter, the spin valve structure may be patterned to form a plurality of STT-MRAM memory cells or STO elements on the substrate 10 by a well known photolithography and etch sequence. In an embodiment where the substrate is a bottom electrode, the bottom electrode may be patterned simultaneously with the overlying spin valve stack to enable a higher density of patterned structures for advanced technology designs.

EXAMPLE 1

Figure 10:
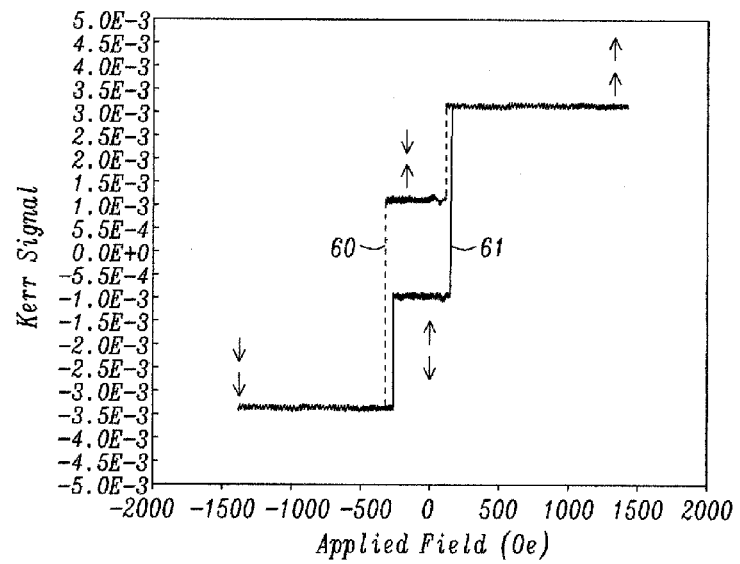
FIG. 10 is a plot of Kerr signal as a function of applied field for a MTJ stack with a SAF free layer according to an embodiment of the present disclosure.

To demonstrate the benefits of the present disclosure, a patterned MTJ stack was fabricated on a Si substrate according to a SAF free layer embodiment related to FIG. 2. The MTJ stack has a MgO/CoFeB5/Fe5/Mo9/Fe5/CoFeB5/MgTaOx6 configuration wherein the number following a layer composition is a thickness in Angstroms of that layer. MgO serves as a tunnel barrier layer, FL1 and FL2 layers are made of $Co_{20}Fe_{60}B_{20}$, DL1 and DL2 layers are Fe, the coupling layer is a Mo film, and MgTaOx is the cap layer. The MgO layer was formed by first depositing an 8 Angstrom thick Mg layer followed by a radical oxidation (ROX), and then deposition of a 4 Angstrom thick Mg layer. The MgTaOx cap was formed by depositing a Mg:Ta film with a 2:1 ratio and then performing a ROX process, although a natural oxidation method could be used. In another embodiment, a sputter deposition process involving a MgTaOx target may be employed to form a MgTaOx capping layer. A seed layer and reference layer are omitted for this study. All layers were deposited at RT and the stack was annealed at 300° C. for 10 minutes. As pictured in FIG. 10, synthetic antiferromagnetic coupling between FL1 and FL2 layers is achieved in the remanent state between applied field −300 Oe and 300 Oe using the SAF free layer structure of this experiment. Results were obtained by magneto-optical microscopy. A similar result is anticipated when CoFeB in FL1 and FL2 layers is replaced by a laminated stack, a L10 ordered alloy, or a RE-TM film as explained earlier. In this example, we rely on MgO and MgTaOx layers to induce PMA in the CoFeB FL1 and FL2 layers, respectively, and the Fe/Mo/Fe stack is used to enhance RKKY coupling.

EXAMPLE 2

Figure 11:
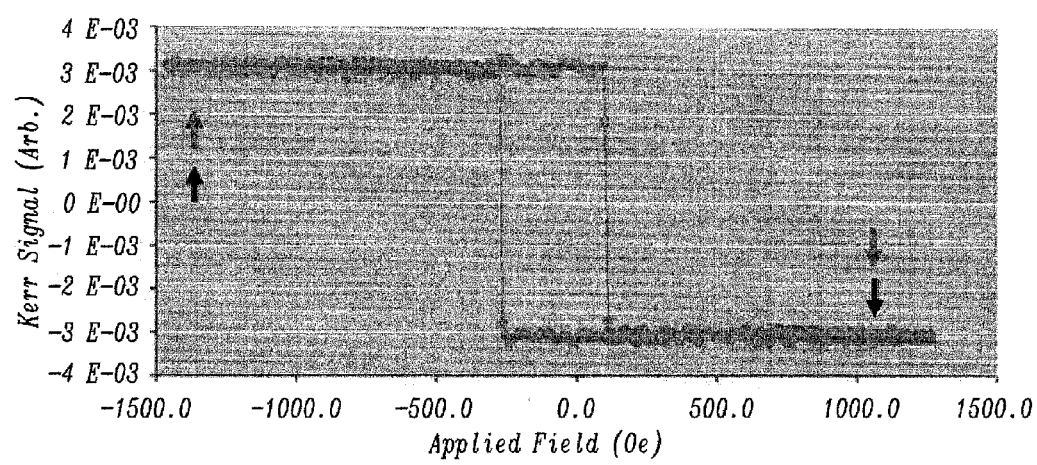
FIG. 11 is a plot of Kerr signal vs. applied field for a MTJ stack with a SyF free layer structure according to an embodiment of the present disclosure.

Referring to FIG. 11, a second experiment was performed to demonstrate that synthetic ferrimagnetic coupling is achieved between FL1 and FL2 layers in a SyF embodiment according to the present disclosure. A patterned MTJ stack with a MgO/CoFeB5/Co4/Ru6/Co4/CoFeB5/MgTaOx6 configuration was fabricated on a Si substrate. The MgO tunnel barrier, CoFeB FL1 and FL2 layers, and MgTaOx cap layer are the same as in the first experiment (Example 1). However, dusting layers DL1 and DL2 are changed to 4 Angstrom thick Co films, and the coupling layer is Ru with a 6 Angstrom thickness. The MTJ stack was annealed at 300° C. for 10 minutes. Free layer magnetic properties are measured perpendicular to the film plane with magneto-optical microscopy and show synthetic ferrimagnetic coupling through a RKKY effect. Note that the plot is consistent with a magnetic state wherein the magnetizations of FL1 and FL2 layers are aligned in the same direction and are perpendicular to the film plane.

The advantages of the SAF embodiments of the present disclosure are improved PMA (Hc and Hk) for a free layer in a magnetic device, and a lower offset field (Ho) on the free layer for better stability. Alternatively, one or both of the FL1 and FL2 layers may be CoFeB or CoNiFeB to enhance the MR ratio while realizing a slight loss in PMA strength. Furthermore, there is enhanced Ku (thermal stability) in the free layer to enable high temperature processing up to at least 400° C. that makes the multilayer stacks described herein suitable for a variety of applications including advanced STT-MRAM devices. Higher thermal stability also increases the retention time of the memory cell for STT-MRAM designs.

While this disclosure has been particularly shown and described with reference to, the preferred embodiment thereof, it will be understood by those skilled in, the art that various changes in form and details may be made without departing from the spirit and scope of this disclosure.

We claim:

1. A synthetic antiferromagnetic (SAF) free layer stack having a thermal stability to at least 400° C. in a magnetic device, comprising:
   (a) a first free layer (FL1) and a second free layer (FL2) each exhibiting perpendicular magnetic anisotropy;
   (b) a coupling layer that induces RKKY (antiferromagnetic) coupling between the FL1 and FL2 layers; and
   (c) a first dusting layer (DL1) and a second dusting layer (DL2) made of Fe, Ni, NiFe, or CoFeNi that enhance the RKKY coupling between the FL1 and FL2 layers, the SAF free layer stack has a structure in which FL1, DL1, coupling layer, DL2, and FL2 layers are consecutively deposited on a substrate that is a tunnel barrier layer or a Cu spacer to give a substrate/FL1/DL1/coupling layer/DL2/FL2 configuration.

2. The SAF free layer stack of claim 1 wherein one or both of the FL1 and FL2 layers are made of a laminate that is $(Ni/Co)_n$, $(Pd/Co)_n$, $(Pt/Co)_n$, $(Co/Ru)_n$, $(Ni/CoFe)_n$, $(Ni/CoFeB)_n$, $(NiFe/Co)_n$, $(NiFeB/Co)_n$, or $(NiCo/Co)_n$ where n is the number of laminations and n is between about 1 and 10.

3. The SAF free layer stack of claim 1 wherein the coupling layer is Ru, Rh, Ir, Cu, Cr, or Mo and has a thickness of about 4, 9, or 13 Angstroms.

4. The SAF free layer stack of claim 1 wherein one or both of the FL1 and FL2 layers are a $L1_0$ alloy that is FePt, CoPt, FePd, NiPt, FeNi, FeCu, MnAl, MnPt, MnPd, or CuAu, or are made of a rare earth-transition metal (RE-TM) alloy.

5. The SAF free layer stack of claim 1 wherein one or both of the FL1 and FL2 layers are comprised of CoFeB or CoNiFeB.

6. The SAF free layer stack of claim 1 wherein the DL1 and DL2 dusting layers have a thickness of about 1 to 50 Angstroms.

7. The SAF free layer stack of claim 1 wherein the substrate is a stack of layers with a bottom seed layer, reference layer, and an upper non-magnetic spacer, the FL1 layer contacts a top surface of the non-magnetic spacer.

8. The SAF free layer stack of claim 1 wherein a capping layer contacts a top surface of the FL2 layer, the capping layer is made of one or more non-magnetic metals or is a dielectric layer.

9. A magnetic device having thermal stability to at least 400° C., comprising:
   (a) a synthetic antiferromagnetic (SAF) free layer that has a FL1/DL1/coupling layer/DL2/FL2 configuration wherein FL1 and FL2 are free layers exhibiting perpendicular magnetic anisotropy, the coupling layer is a non-magnetic metal that induces RKKY (antiferromagnetic) coupling between the FL1 and FL2 layers, and DL1 and DL2 are Co, Fe, Ni, CoNiFe, or NiFe dusting layers that enhance the RKKY coupling;
   (b) a synthetic antiferromagnetic (SAF) reference layer; and
   (c) a non-magnetic spacer formed between the SAF reference layer and SAF free layer wherein the FL1 layer contacts a top surface of the non-magnetic spacer that is a tunnel barrier layer or a Cu spacer in a bottom spin valve configuration, or the FL2 layer contacts a bottom surface of the non-magnetic spacer in a top spin valve configuration.

10. The magnetic device of claim 9 that has a bottom spin valve configuration wherein the SAF reference layer, a transition layer made of CoNiFeB, CoFe, CoFeB, Co, or composites thereof, the non-magnetic spacer, and the SAF free layer are sequentially formed on a substrate that is a seed layer.

11. The magnetic device of claim 9 that has a bottom spin valve configuration wherein the SAF reference layer, non-magnetic spacer, and SAF free layer are sequentially formed on a substrate that is a seed layer, and the SAF reference layer has a AP2/second coupling layer/AP1 configuration wherein the AP1 layer exhibits PMA and contacts a bottom surface of the non-magnetic spacer.

12. The magnetic device of claim 11 wherein the AP2 layer has PMA, the second coupling layer enables RKKY coupling between AP2 and AP1 layers, and the SAF reference layer is further comprised of a dusting layer between the AP2 layer and second coupling layer, and a dusting layer between the second coupling layer and the AP1 layer to enhance RKKY coupling between the AP1 and AP2 layers.

13. The magnetic device of claim 9 wherein one or both of the FL1 and FL2 layers are made of a laminate that is $(Ni/Co)_n$, $(Pd/Co)_n$, $(Pt/Co)_n$, $(Co/Ru)_n$, $(Ni/CoFe)_n$, $(Ni/CoFeB)_n$, $(NiFe/Co)_n$, $(NiFeB/Co)_n$, or $(NiCo/Co)_n$ where n is the number of laminations and n is between about 1 and 10.

14. The magnetic device of claim 9 wherein one or both of the FL1 and FL2 layers are a $L1_0$ alloy that is FePt, CoPt, FePd, NiPt, FeNi, FeCu, MnAl, MnPt, MnPd, or CuAu, or are a rare earth-transition metal (RE-TM) alloy.

15. The magnetic device of claim 9 wherein one or both of the FL1 and FL2 layers are CoFeB or CoNiFeB.

16. The magnetic device of claim 9 wherein the coupling layer is Ru, Rh, Ir, Cu, Cr, or Mo and has a thickness of about 4, 9, or 13 Angstroms.

17. The magnetic device of claim 9 wherein the DL1 and DL2 dusting layers have a thickness from about 1 to 10 Angstroms.

18. A spin transfer oscillator (STO) structure, comprising:
(a) a first non-magnetic layer (NM1) which adjoins a substrate that is a first terminal;
(b) a spin injection layer (SIL) that is a synthetic antiferromagnetic (SAF) reference layer, the SIL contacts the first non-magnetic layer;
(c) a second non-magnetic layer (NM2) that adjoins a second terminal;
(d) a field generation layer (FGL) that contacts the second non-magnetic layer and has a FL1/DL1/coupling layer/DL2/FL2 configuration wherein FL1 and FL2 are free layers exhibiting perpendicular magnetic anisotropy, the coupling layer is a non-magnetic metal that induces RKKY (antiferromagnetic) coupling between the FL1 and FL2 layers, and DL1 and DL2 are Co, Fe, Ni, CoNiFe, or NiFe dusting layers that enhance the RKKY coupling; and
(e) a third non-magnetic layer (NM3) formed between the spin injection layer and the field generation layer to give a STO stack with a NM1/SIL/NM3/FGL/NM2 configuration.

19. The STO structure of claim 18 wherein the first terminal is a main pole layer and the second terminal is a write shield in a microwave assisted magnetic recording device.

20. The STO structure of claim 18 wherein one or both of the FL1 and FL2 layers are made of a laminate that is $(Ni/Co)_n$, $(Pd/Co)_n$, $(Pt/Co)_n$, $(Co/Ru)_n$, $(Ni/CoFe)_n$, $(Ni/CoFeB)_n$, $(NiFe/Co)_n$, $(NiFeB/Co)_n$, or $(NiCo/Co)_n$ where n is the number of laminations and n is between about 1 and 10.

21. The STO structure of claim 18 wherein one or both of the FL1 and FL2 layers are a $L1_0$ alloy that is FePt, CoPt, FePd, NiPt, FeNi, FeCu, MnAl, MnPt, MnPd, or CuAu, or are a rare earth-transition metal (RE-TM) alloy.

22. The STO structure of claim 18 wherein one or both of the FL1 and FL2 layers are CoFeB or CoNiFeB.

23. The STO structure of claim 18 wherein the coupling layer is Ru, Rh, Ir, Cu, Cr, or Mo and has a thickness of about 4, 9, or 13 Angstroms.

24. The STO structure of claim 18 wherein the DL1 and DL2 dusting layers have a thickness from about 1 to 10 Angstroms.

25. A dual synthetic antiferromagnetic (SAF) free layer stack, comprising:
(a) a first free layer (FL1) and a second free layer (FL2) each exhibiting perpendicular magnetic anisotropy;
(b) a first spacer that induces RKKY (antiferromagnetic) coupling between the FL1 and FL2 layers;
(c) a first dusting layer (DL1) and a second dusting layer (DL2) that enhance the RKKY coupling between the FL1 and FL2 layers;
(d) a third free layer (FL3) formed as the uppermost layer in the dual SAF free layer stack;
(e) a second spacer that induces RKKY coupling between the FL3 and FL2 layers; and
(f) third (DL3) and fourth (DL4) dusting layers that enhance RKKY coupling between the FL2 and FL3 layers, the multilayer stack has a structure in which the FL1, DL1, first spacer, DL2, FL2, DL3, second spacer, DL4, and FL3 layers are consecutively formed on a substrate to give a configuration that is represented by FL1/DL1/first spacer/DL2/FL2/DL3/second spacer/DL4/FL3.

26. The dual SAF free layer stack of claim 25 wherein one or more of the FL1, FL2, and FL3 layers are made of a laminate that is $(Ni/Co)_n$, $(Pd/Co)_n$, $(Pt/Co)_n$, $(Co/Ru)_n$, $(Ni/CoFe)_n$, $(Ni/CoFeB)_n$, $(NiFe/Co)_n$, $(NiFeB/Co)_n$, or $(NiCo/Co)_n$ where n is the number of laminations and n is between about 1 and 10.

27. The dual SAF free layer stack of claim 25 wherein one or more of the FL1, FL2, and FL3 layers are a $L1_0$ alloy that is FePt, CoPt, FePd, NiPt, FeNi, FeCu, MnAl, MnPt, MnPd, or CuAu, or are a rare earth-transition metal (RE-TM) alloy.

28. The dual SAF free layer stack of claim 25 wherein the first spacer and second spacer are one of Ru, Rh, Ir, Cu, Cr, or Mo and each spacer has a thickness of about 4, 9, or 13 Angstroms.

29. The dual SAF free layer stack of claim 25 wherein the DL1, DL2, DL3, and DL4 dusting layers are selected from one of Co, Fe, Ni, NiFe, or CoFeNi.

30. The dual SAF free layer stack of claim 25 wherein one or more of the FL1, FL2, and FL3 layers are CoFeB or CoFeNiB.

31. A synthetic ferrimagnetic (SyF) free layer stack, comprising:
(a) a first free layer (FL1) and a second free layer (FL2) each exhibiting perpendicular magnetic anisotropy;
(b) a coupling layer having a thickness that induces coupling between the FL1 and FL2 layers such that a magnetization in the FL1 layer is aligned in the same perpendicular to plane direction as a magnetization in the FL2 layer; and
(c) a first dusting layer (DL1) and a second dusting layer (DL2) made of Fe, Ni, NiFe, or CoFeNi that enhances the coupling between the FL1 and FL2 layers, the SyF free layer stack has a structure in which FL1, DL1, coupling layer, DL2, and FL2 layers are consecutively deposited on a substrate that is a tunnel barrier layer or Cu spacer to give a substrate/FL1/DL1/coupling layer/DL2/FL2 configuration.

32. The SyF free layer stack of claim 31 wherein one or both of the FL1 and FL2 layers are a laminate that is $(Ni/Co)_n$, $(Pd/Co)_n$, $(Pt/Co)_n$, $(Co/Ru)_n$, $(Ni/CoFe)_n$, $(Ni/CoFeB)_n$, $(NiFe/Co)_n$, $(NiFeB/Co)_n$, or $(NiCo/Co)_n$ where n is the number of laminations and n is between about 1 and 10.

33. The SyF free layer stack of claim 31 wherein one or both of the FL1 and FL2 layers are a $L1_0$ alloy that is FePt, CoPt, FePd, NiPt, FeNi, FeCu, MnAl, MnPt, MnPd, or CuAu, or are a rare earth-transition metal (RE-TM) alloy.

34. The SyF free layer stack of claim 31 wherein one or both of the FL1 and FL2 layers are CoFeB or CoNiFeB.

35. The SyF free layer stack of claim 31 wherein the coupling layer is Ru, Rh, Ir, Cu, Cr, or Mo and has a thickness of about 6 Angstroms or less than about 3 Angstroms.

36. A method of forming a synthetic antiferromagnetic (SAF) free layer, comprising:
(a) providing a substrate that is a tunnel barrier layer or a Cu spacer;
(b) depositing a first ferromagnetic layer (FL1) on the substrate;
(c) depositing a first dusting layer (DL1) that contacts a top surface of the FL1 layer;
(d) forming a coupling layer that is one of Fe, Ni, NiFe, or CoFeNi on the DL1 layer, the coupling layer induces antiferromagnetic coupling between the FL1 layer and a subsequently deposited FL2 layer;
(e) depositing a second dusting layer (DL2) on the coupling layer, the first and second dusting layers enhance antiferromagnetic coupling between the FL1 and FL2 layers;

(f) depositing the second ferromagnetic layer (FL2) on a top surface of the DL2 layer to give a substrate/FL1/DL1/coupling layer/DL2/FL2 stack of layers; and (g) annealing the SAF free layer.

37. The method of claim 36 wherein the dusting layers are deposited at room temperature or at a temperature up to at least 400° C.

38. The method of claim 36 wherein the annealing step comprises heating the SAF free layer to a temperature between about 200° C. and 500° C. for about 1 minute to 10 hours.

39. The method of claim 36 wherein one or both of the FL1 and FL2 layers are a laminate that is $(Ni/Co)_n$, $(Pd/Co)_n$, $(Pt/Co)_n$, $(Co/Ru)_n$, $(Ni/CoFe)_n$, $(Ni/CoFeB)_n$, $(NiFe/Co)_n$, $(NiFeB/Co)_n$, or $(NiCo/Co)_n$ where n is the number of laminations and n is between about 1 and 10, or are CoFeB or CoNiFeB.

40. The method of claim 36 wherein one or more of the FL1 and FL2 layers are a $L1_0$ alloy that is FePt, CoPt, FePd, NiPt, FeNi, FeCu, MnAl, MnPt, MnPd, or CuAu, or are made of a rare earth-transition metal (RE-TM) alloy.

41. The method of claim 36 wherein the substrate comprises a stack of layers having a synthetic antiferromagnetic (SAF) reference layer and a non-magnetic spacer, the non-magnetic spacer is formed between the SAF reference layer and the FL1 layer.

42. A magnetic device, comprising:

(a) a synthetic antiferromagnetic (SAF) free layer that has a FL1/DL1/coupling layer/DL2/FL2 configuration wherein FL1 and FL2 are free layers exhibiting perpendicular magnetic anisotropy, the coupling layer is a non-magnetic metal that induces RKKY (antiferromagnetic) coupling between the FL1 and FL2 layers, and DL1 and DL2 are Co, Fe, Ni, CoNiFe, or NiFe dusting layers that enhance the RKKY coupling;

(b) a synthetic antiferromagnetic (SAF) reference layer;

(c) a non-magnetic spacer formed between the SAF reference layer and SAF free layer; and (d) a transition layer made of CoNiFeB, CoFe, CoFeB, Co, or composites thereof that contacts a top surface of the FL2 layer and a bottom surface of the non-magnetic spacer in a top spin valve configuration.

* * * * *